(12) United States Patent
Yang et al.

(10) Patent No.: US 8,362,593 B2
(45) Date of Patent: Jan. 29, 2013

(54) METHOD FOR STACKING SEMICONDUCTOR DIES

(75) Inventors: Ku-Feng Yang, Dali (TW); Weng-Jin Wu, Hsin-Chu (TW); Wen-Chih Chiou, Miaoli (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 27 days.

(21) Appl. No.: 13/168,351

(22) Filed: Jun. 24, 2011

(65) Prior Publication Data

US 2011/0248409 A1    Oct. 13, 2011

Related U.S. Application Data

(63) Continuation of application No. 12/330,209, filed on Dec. 8, 2008, now Pat. No. 7,989,318.

(51) Int. Cl.
*H01L 29/06* (2006.01)

(52) U.S. Cl. .................................. 257/619; 257/698

(58) Field of Classification Search .................. None
See application file for complete search history.

(56) References Cited

U.S. PATENT DOCUMENTS

| | | | |
|---|---|---|---|
| 6,162,702 A | 12/2000 | Morcom et al. | |
| 6,753,205 B2 | 6/2004 | Halahan | |
| 6,787,916 B2 | 9/2004 | Halahan | |
| 7,348,275 B2 | 3/2008 | Sekiya | |
| 7,354,649 B2 | 4/2008 | Dolechek et al. | |
| 7,629,230 B2 | 12/2009 | Sekiya et al. | |
| 2008/0242052 A1 | 10/2008 | Feng et al. | |
| 2009/0227047 A1 | 9/2009 | Yang et al. | |

FOREIGN PATENT DOCUMENTS

CN    101276740 A    10/2008

*Primary Examiner* — Bradley K Smith
(74) *Attorney, Agent, or Firm* — Slater & Matsil, L.L.P.

(57) ABSTRACT

A system and method for stacking semiconductor dies is disclosed. A preferred embodiment comprises forming through-silicon vias through the wafer, protecting a rim edge of the wafer, and then removing the unprotected portions so that the rim edge has a greater thickness than the thinned wafer. This thickness helps the fragile wafer survive further transport and process steps. The rim edge is then preferably removed during singulation of the individual dies from the wafer.

20 Claims, 7 Drawing Sheets

METHOD FOR STACKING SEMICONDUCTOR DIES

This application is a continuation U.S. patent application Ser. No. 12/330,209, filed Dec. 8, 2008, and entitled "Method for Stacking Semiconductor Dies," which application is hereby incorporated herein by reference.

TECHNICAL FIELD

The present invention relates generally to a system and method for connecting semiconductor dies and, more particularly, to a system and method for connecting semiconductor dies utilizing a through-silicon via.

BACKGROUND

Generally, two semiconductor dies may be connected using through-silicon vias (TSVs), which generally require some type of removal of material from the backside of the wafers on which the semiconductor dies are formed. In one method of forming TSVs, a portion of the side of the wafer containing active devices is removed to form one or more holes at least part of the way through the silicon wafer. After the holes have been filled with a conductive material, the backside of the wafer is removed using a process such as mechanical grinding or etching in order to expose the conductive material and form a contact through the backside of the wafer to the front side of the wafer.

However, as materials such as low-k or extremely low-k dielectrics are beginning to become more widely used, these methods become a problem. These materials are very fragile and do not withstand the stresses from various process steps very well. This problem becomes magnified when the wafers are thinned by mechanical grinding or etching as the dielectrics may become unable to stand further handling and processing, which may result in damage and, eventually, device failure.

As such, what is needed is a new method of forming TSVs that reduce or prevent damage to a thinned wafer during subsequent handling and processing.

SUMMARY OF THE INVENTION

These and other problems are generally solved or circumvented, and technical advantages are generally achieved, by preferred embodiments of the present invention which provide for a system and method of stacking dies utilizing through-silicon vias.

In accordance with a preferred embodiment of the present invention, a method for forming a semiconductor device comprises providing a wafer with a first side, a second side opposite the first side, and at least one TSV. An edge of the wafer on the second side is protected, and the second side of the wafer is thinned to expose the at least one TSV without thinning the edge of the second side, thereby forming a thinned portion and an unthinned edge. The thinned portion of the wafer is separated from the unthinned edge.

In accordance with another preferred embodiment of the present invention, a method for forming a semiconductor device comprises providing a wafer comprising a first side and a second side opposite the first side, the second side of the wafer comprising a first portion and a second portion surrounding the first portion. At least one TSV is formed in the first portion of the wafer. The second portion of the wafer is protected and the first portion of the wafer is thinned to expose the at least one TSV without thinning the second portion of the wafer. The thinning forms a thinned first portion of the wafer and an unthinned second portion of the wafer. The thinned first portion of the wafer is separated from the unthinned second portion of the wafer.

In accordance with yet another preferred embodiment of the present invention, a method for forming semiconductor devices comprises providing a semiconductor wafer having an inner die area surrounded by a scriber line and an outer area immediately adjacent to the scribe line, the semiconductor wafer comprising a first side and a second side. Conductive vias are formed partially through the semiconductor wafer from the first side, and the inner die area on the second side of the wafer is thinned to expose the conductive vias without thinning the outer area.

In accordance with yet another embodiment, a device comprises a substrate with a first side and a second side opposite the first side, the first side of the substrate having a first region with a first thickness and a second region with a second thickness, the first thickness being less than the second thickness, the second region being along an outside edge of the substrate. A conductive plug extends through the first region of the substrate, and a protector is over the second region of the substrate and on a sidewall of the substrate.

In accordance with yet another embodiment, a device comprises a substrate comprising a first side and a second side, the first side comprising a first region and a second region. A cavity is in the substrate, the cavity located over the first region of the substrate, wherein the second region of the substrate is located outside of the cavity. A conductive plug extends through the first region of the substrate. A protective material is over the second region of the substrate and along a sidewall of the substrate, the sidewall extending between the first side and the second side.

In accordance with yet another embodiment, a semiconductor device comprises a substrate comprising a die region and an edge region, wherein the die region has a thickness less than the edge region. A conductive plug extends through the die region of the substrate and a protector is located over the edge region and extends along a sidewall of the substrate. A semiconductor die is located over the die region and is electrically connected to the conductive plug.

An advantage of a preferred embodiment of the present invention is that the unthinned portion of the wafer allows the wafer to better handle stresses that are inherent in later processing steps and handling of the wafer. This ability reduces or eliminates potential damage that could occur through processing and handling, thereby leading to an increased yield of dies.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely stacked dies utilizing through-silicon vias in a semiconductor wafer. The invention may also be applied, however, to other thin wafer handling processes.

Figure 1:
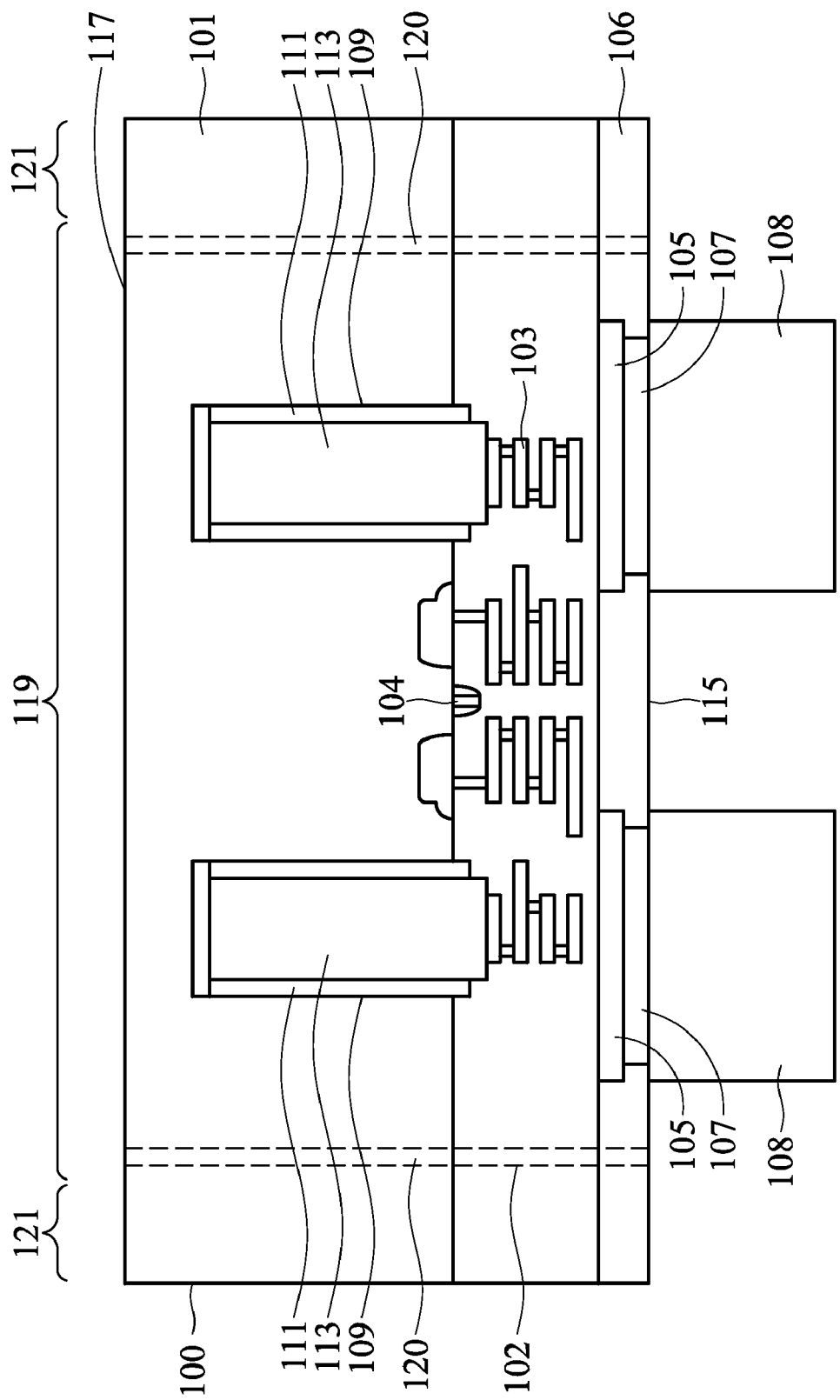
FIG. 1 illustrates a wafer with through-silicon vias formed partially through the wafer in accordance with an embodiment of the present invention.

With reference now to FIG. 1, there is shown a cross-sectional view of a wafer 100 with a front side 115 and a backside 117. The wafer 100 preferably has a plurality of first semiconductor dies 102 (outlined by the dashed lines) formed in a die area 119 of the wafer 100, a scribe line 120 adjacent to the die area 119 of the wafer 100, and an edge 121 preferably immediately adjacent the scribe line 120 of the wafer 100. However, for the sake of clarity in the presentation of the present invention, FIGS. 1, 2A, 3A, and 4-5 clearly show only a single first semiconductor die 102, and it is to be understood that, while only a single first semiconductor die 102 is shown, any number of first semiconductor dies 102 may be formed on the wafer 100 while remaining within the scope of the present invention.

The first semiconductor die 102 preferably comprises a substrate 101, active devices 104, metallization layers 103, contact pads 105, underbump metallization (UBM) 107, contact bumps 108, and through-silicon vias (TSVs) 109. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 104 are represented on FIG. 1 as a single transistor. However, as one of skill in the art will recognize, a wide variety of active devices such as capacitors, resistors, inductors and the like may be used to generate the desired structural and functional requirements of the design. The active devices 104 may be formed using any suitable methods either within or else on the surface of the substrate 101.

The TSVs 109 are preferably formed by applying and developing a suitable photoresist (not shown), and then etching the substrate 201 to generate TSV openings (filled later as discussed below). Preferably, the openings for the TSVs 109 at this stage are formed so as to extend into the substrate 101 at least further than the active devices 104 formed within and on the substrate 101, and preferably to a depth at least greater than the eventual desired height of the finished first semiconductor die 102. Accordingly, while the depth is dependent upon the overall design of the first semiconductor die 102, the depth is preferably between about 1 μm and about 700 μm below the surface on the substrate 101, with a preferred depth of about 50 μm. The openings for the TSVs 109 are preferably formed to have a diameter of between about 1 μm and about 100 μm, with a preferred diameter of about 6 μm.

Once the openings for the TSVs 109 have been formed, the openings for the TSVs 109 are preferably filled with a barrier layer 111 and a conductive material 113. The barrier layer 111 preferably comprises a conductive material such as titanium nitride, although other materials, such as tantalum nitride, titanium, a dielectric, or the like may alternatively be utilized. The barrier layer 111 is preferably formed using a CVD process, such as PECVD. However, other alternative processes, such as sputtering or metal organic chemical vapor deposition (MOCVD), may alternatively be used. The barrier layer 111 is preferably formed so as to contour to the underlying shape of the opening for the TSVs 109.

The conductive material 113 preferably comprises copper, although other suitable materials such as aluminum, alloys, doped polysilicon, combinations thereof, and the like, may alternatively be utilized. The conductive material 113 is preferably formed by depositing a seed layer and then electroplating copper onto the seed layer, filling and overfilling the openings for the TSVs 109. Once the openings for the TSVs 109 have been filled, excess barrier layer 111 and excess conductive material 113 outside of the openings for the TSVs 109 are preferably removed through a grinding process such as chemical mechanical polishing (CMP), although any suitable removal process may be used.

The metallization layers 103 are preferably formed over the substrate 101 and the active devices 104 and are designed to connect the various active devices 104 to form functional circuitry. The metallization layers 103 are preferably formed of alternating layers of dielectric and conductive material and may be formed through any suitable process (such as deposition, damascene, dual damascene, etc.). Preferably, there are at least four layers of metallization separated from the substrate 101 by at least one interlayer dielectric layer (ILD), but the precise number of metallization layers 103 is dependent upon the design of the first semiconductor die 102.

The contact pads 105 are preferably formed to connect the metallization layers 103 to exterior input/output connections, such as the UBM 107. The contact pads 105 are preferably formed of aluminum, although other materials, such as aluminum alloy, aluminum copper, copper, combinations of these, and the like, may alternatively be used. Further, the contact pads 105 may be formed in a variety of methods depending upon the material used. For example, if aluminum is used the contact pads 105 are preferably formed by forming a layer of aluminum over the metallization layers 103, and then using a suitable technique such as photolithography and chemical etching to pattern the aluminum into the contact pads 105. Alternatively, if copper is used the contact pads 105 are preferably formed by initially forming a dielectric layer 106, forming openings into the dielectric layer 106, depositing a barrier layer and a seed layer (not shown), overfilling the openings with copper, and then using a grinding process such as CMP to remove excess copper outside of the openings to form the contact pads 105. Any suitable process for forming the contact pads 105 may be used and all of these processes are fully intended to be included within the scope of the present invention.

The UBMs 107 are intended to act as an intermediary between the contact pads 105 and the contact bumps 108. The UBMs 107 are preferably formed so as to make physical and electrical contact with the contact pads 105. The UBMs 107 are preferably made of at least three layers of conductive materials, such as a layer of chrome, a layer of a chrome-copper alloy, and a layer of copper, with an optional layer of gold over the top of the copper layer. However, one of skill in the art will recognize that there are many suitable arrangements of materials and layers, such as an arrangement of titanium/titanium tungsten/copper or an arrangement of copper/nickel/gold, that are suitable for the formation of the UBMs 107. Any suitable materials or layers of material that may be used for the UBMs 107 are fully intended to be included within the scope of the current application.

The UBMs 107 are preferably created by forming each layer conformally over the contact pads. The forming of each layer is preferably performed using a CVD process, such as PECVD, although other processes of formation, such as sputtering, evaporation, or plating process, may alternatively be used depending upon the desired materials. Each of the layers within the UBMs 107 preferably has a thickness of between about 10 µm and about 100 µm, with a preferred thickness of about 45 µm. Once the desired layers have been formed, portions of the layers are then removed through a suitable photolithographic masking and etching process to remove the undesired material and to leave the patterned UBMs 107.

The contact bumps 108 preferably comprise a material such as tin, or other suitable materials, such as silver or copper. In an embodiment in which the contact bumps 108 are tin solder bumps, the contact bumps 108 may be formed by initially forming a layer of tin through any suitable method such as evaporation, electroplating, printing, solder transfer, ball placement, etc, to a preferred thickness of about 100 µm. Once a layer of tin has been formed on the structure, a reflow is preferably performed in order to shape the material into the desired bump shape.

The scribe line 120 of the wafer preferably surrounds the plurality of semiconductor dies 102. The scribe line 120 is preferably formed by not placing functional structures (such as active devices 104) into the area intended for the scribe line 120. Other structures, such as test pads or dummy metals used for planarization, could be placed into the scribe line 120, but would not be necessary for the functioning of the semiconductor dies 102 once the semiconductor dies 102 have been cut from the wafer 100. The scribe lines 120 preferably have a width of between about 20 µm and about 180 µm, with a preferred width of about 80 µm.

However, as one of skill in the art will recognize, the above description, while exemplary, is also merely illustrative, and should not be viewed as limiting the present invention to just this embodiment. Numerous variations in the initial structure of the first semiconductor die 102 may alternatively be used. For example, a structure wherein the TSVs 109 extend not only through the substrate 101 but are also formed to extend through one or more of the metallization layers 103 may also be utilized. Any of these embodiments, and any other suitable embodiments, are fully intended to be within the scope of the scope of the present invention.

Figure 2A:
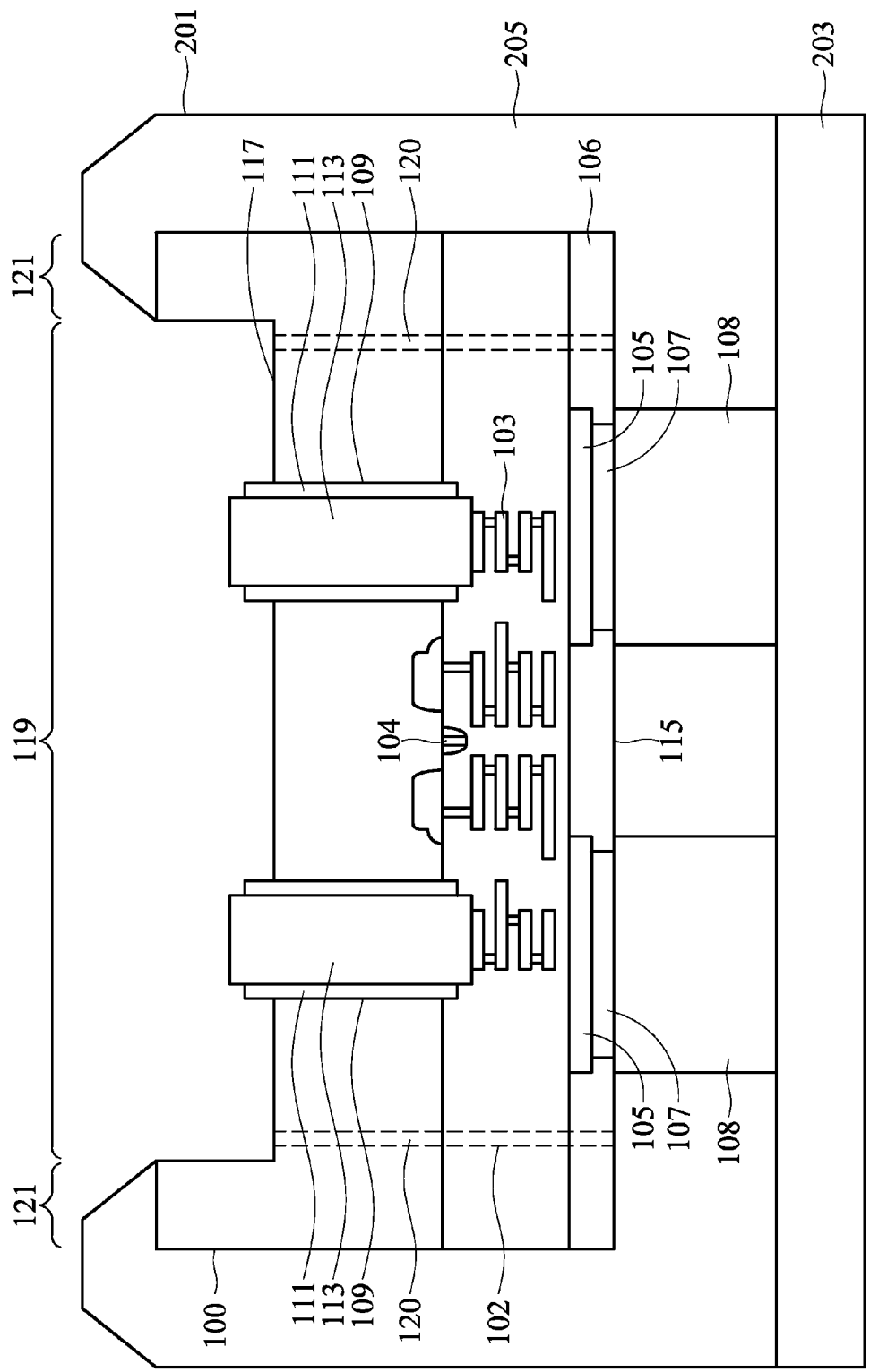
FIGS. 2A-2B illustrate cross-sectional and plan views, respectively, of a thinning of a portion of the wafer in accordance with an embodiment of the present invention.

FIG. 2A illustrates a thinning of the backside 117 of the wafer 100. In this embodiment the wafer 100 is preferably placed into a bottom portion 203 of a chuck 201 with the front side 115 downward. A top portion 205 of the chuck 201 is then preferably connected to the bottom portion 203 of the chuck 201, with the top portion 205 of the chuck 201 overlying and protecting the edge 121 of the wafer 100 immediately adjacent to the scribe line 120 while leaving the scribe line 120 and the die area 119 exposed. A series of one or more seals (not shown) is also preferably used to ensure an adequate seal between the chuck 201 and the wafer 100, and to ensure that no contaminants can reach the edge 121 or the backside 117 of the wafer 100.

However, as one of ordinary skill in the art will recognize, this chuck 201 is only illustrative of a single suitable method for protecting the front side 115 of the wafer 100 and those portions of the backside 117 of the wafer 100 that are preferably not removed. Any other suitable method, such as forming one or more photoresists layers or using adhesive tape to protect the areas, may alternatively be utilized. All of these methods are fully intended to be included within the scope of the present invention.

Once the edge 201 of the backside 117 of the wafer 100 has been protected, the unprotected die area 119 of the wafer 100 is preferably thinned so as to expose the TSVs 109 and to transfer the pattern of the chuck 201 onto the edge 121 of the wafer 100. The thinning is preferably performed using a two step wet etch process: a bulk removal etch and a finishing etch. The bulk removal etch is preferably performed using a mixture of nitric acid ($HNO_3$), sulfuric acid ($H_2SO_4$), hydrogen fluoride (HF), and phosphoric acid ($H_3PO_4$) commercially known as Spin-Etch D in order to remove the bulk of the wafer 100 down to the TSVs 109. Preferably, given a 700 µm wafer thickness, the thinning preferably removes between about 600 µm and about 670 µm, with a preferred removal of about 650 µm.

Once the bulk removal has been performed, an overetch of the wafer 100 is preferably performed such that a portion of the barrier layer 111 is removed and the TSVs 109 extend away from the remaining wafer 100. The overetch is preferably performed using an etchant, such as tetramethylammonium nhydroxide (TMAH) which has a very high selectivity between the material of the wafer (e.g., silicon) and the conductive material 113 of the TSV 109 (e.g., copper). The overetch preferably removes the material of the wafer such that the TSVs 109 extend between about 10 µm and about 0.5 µm from the wafer 100, with a preferred extension of about 1 µm.

Figure 2B:
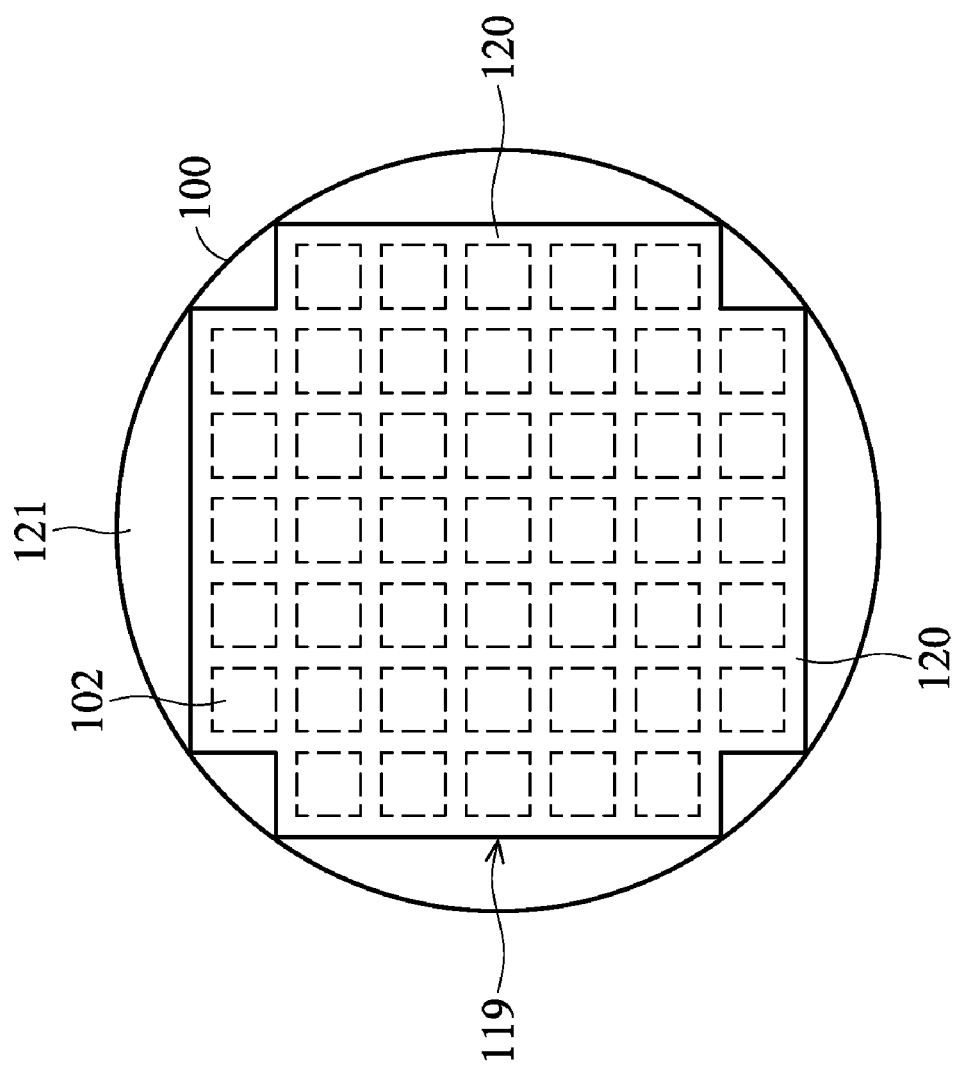

FIG. 2B illustrates a plan view of the backside 117 of the wafer 100 after the backside 117 has been thinned and the chuck 201 has been removed. As illustrated, the chuck 201 preferably forms an edge 121 that expands as far as feasible from the outer edge without interfering with the outermost scribe line 120 or the plurality of semiconductor dies 102 (represented by the dashed lines) in the die area 119. Accordingly, the inner boundary of the edge 121 preferably conforms to the shape of the die area 119.

Figure 3A:
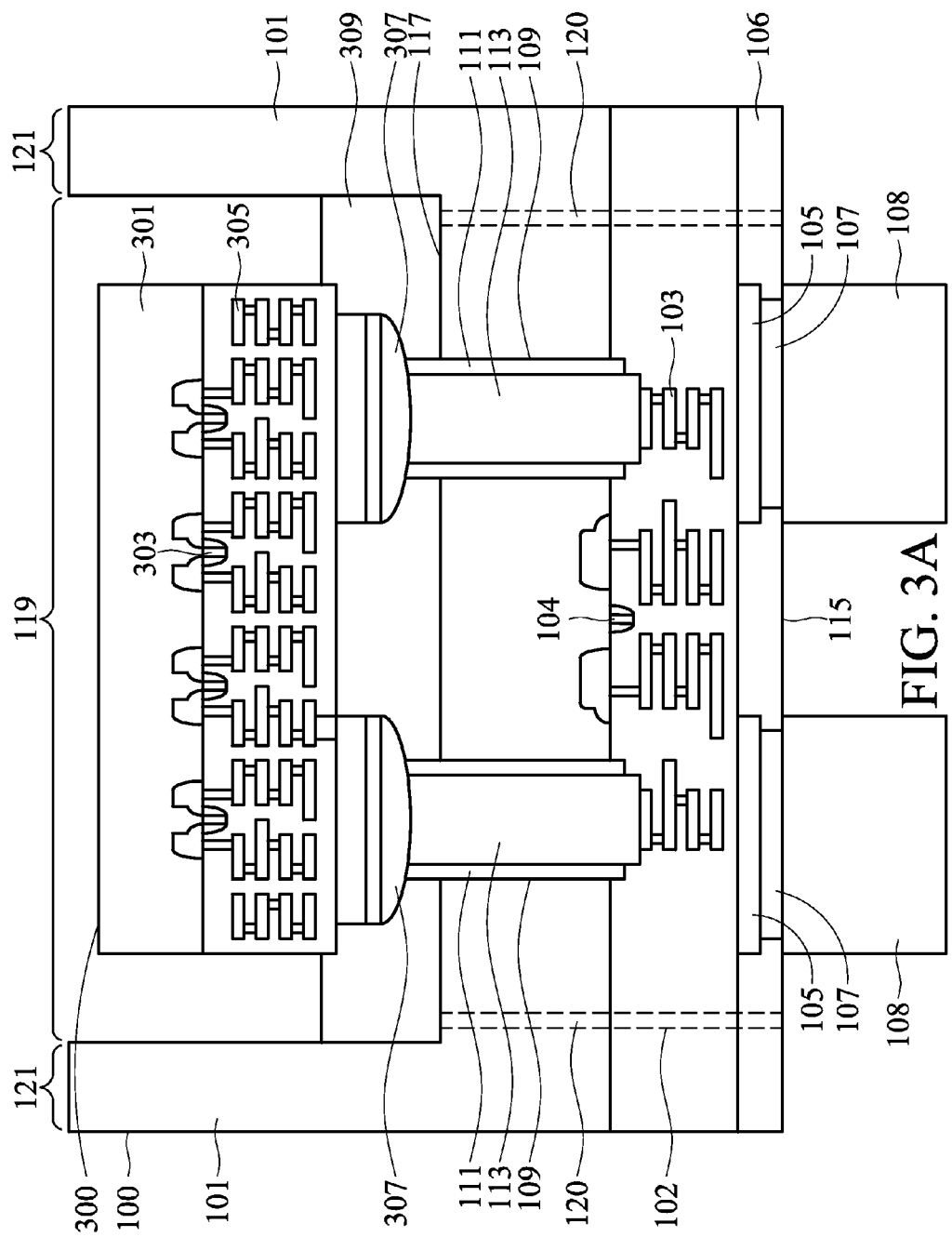
FIGS. 3A-3B illustrate cross-sectional and plan views, respectively, of the bonding of a second die to the wafer in accordance with an embodiment of the present invention.

FIG. 3A illustrates the bonding of a second semiconductor die 300 to the first semiconductor die 102. The second semiconductor die 300 preferably contains structures similar to the wafer 100, such as a second substrate 301, a second set of active devices 303, a second set of metallization layers 305, and second contact bumps 307 on a first side of the second semiconductor die 300, and these structures are preferably made in a similar fashion as described above with respect to FIG. 1. However, the second semiconductor die 300 is not intended to be limited to just this embodiment, and any suitable device that is desired to be connected to the first semiconductor die 102 may alternatively be used.

Preferably, the second semiconductor die 300 is placed within a cavity formed from the edge 121 and the thinned backside 117 of the wafer 100. Additionally, the first semiconductor die 102 and wafer 100 are preferably aligned such that the second contact pads 307 are in alignment with the TSVs 109. Once aligned, the second contact bumps 307 and the TSVs 109 are then preferably bonded together by contacting the second contact bumps 307 to the TSVs 109 and performing a reflow to reflow the material of the second contact bumps 307 and bond to the TSVs 109. Any suitable method of bonding, however, such as copper-copper bonding, may alternatively be utilized to bond the second semiconductor die 300 to the first semiconductor die 102.

An underfill material 309 is preferably injected or otherwise formed in the space between the first semiconductor die 102 and the second semiconductor die 300. The underfill material 309 may, for example, comprise a liquid epoxy that is dispensed between the first semiconductor die 102 and the second semiconductor die 300, and then cured to harden. This underfill material 309 is used to prevent cracks from being formed in the contact bumps 307, wherein cracks are typically caused by thermal stresses.

Alternatively, either a deformable gel or silicon rubber could be formed between the first semiconductor die 102 and the second semiconductor die 300 in order to help prevent cracks from occurring within the contact bumps 307. This gel or silicon rubber may be formed by injecting or otherwise placing the gel or rubber between the first semiconductor die 102 and the second semiconductor die 300. The deformable gel or silicon rubber can provide greater stress relief during subsequent processing.

Figure 3B:
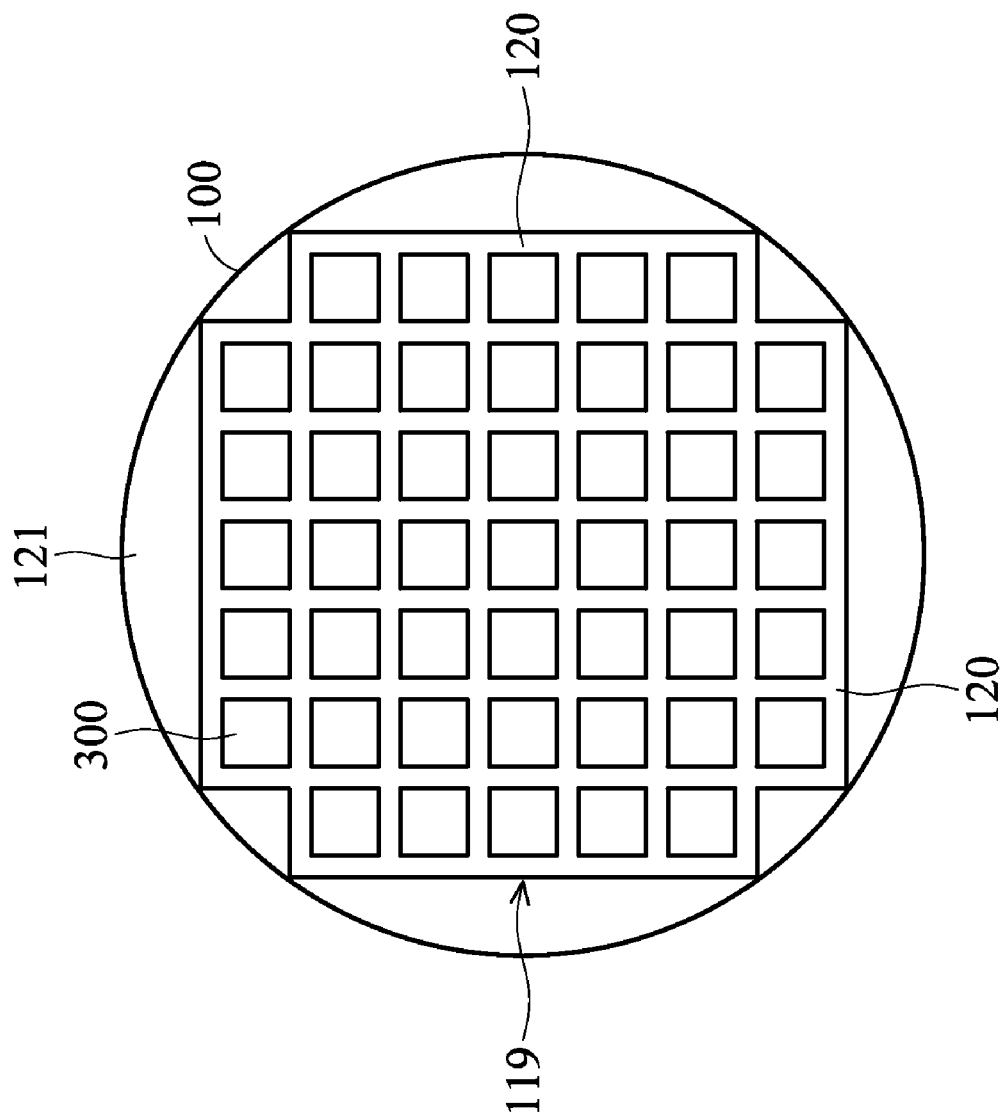

FIG. 3B illustrates a plan view of the backside 117 of the wafer 100 after the second semiconductor die 300 has been attached. As is apparent, multiple second semiconductor dies 300 are preferably attached to individual ones of the plurality of first semiconductor dies 102 formed on the wafer 100 (not visible in FIG. 3A but located under the second semiconductor dies 300). As is also apparent, the edge 121 of the wafer 100 preferably extends from the outer edge of the wafer 100 as far as feasible towards the die area 119, thereby preferably conforming to the shape of the die area 119.

Figure 4:
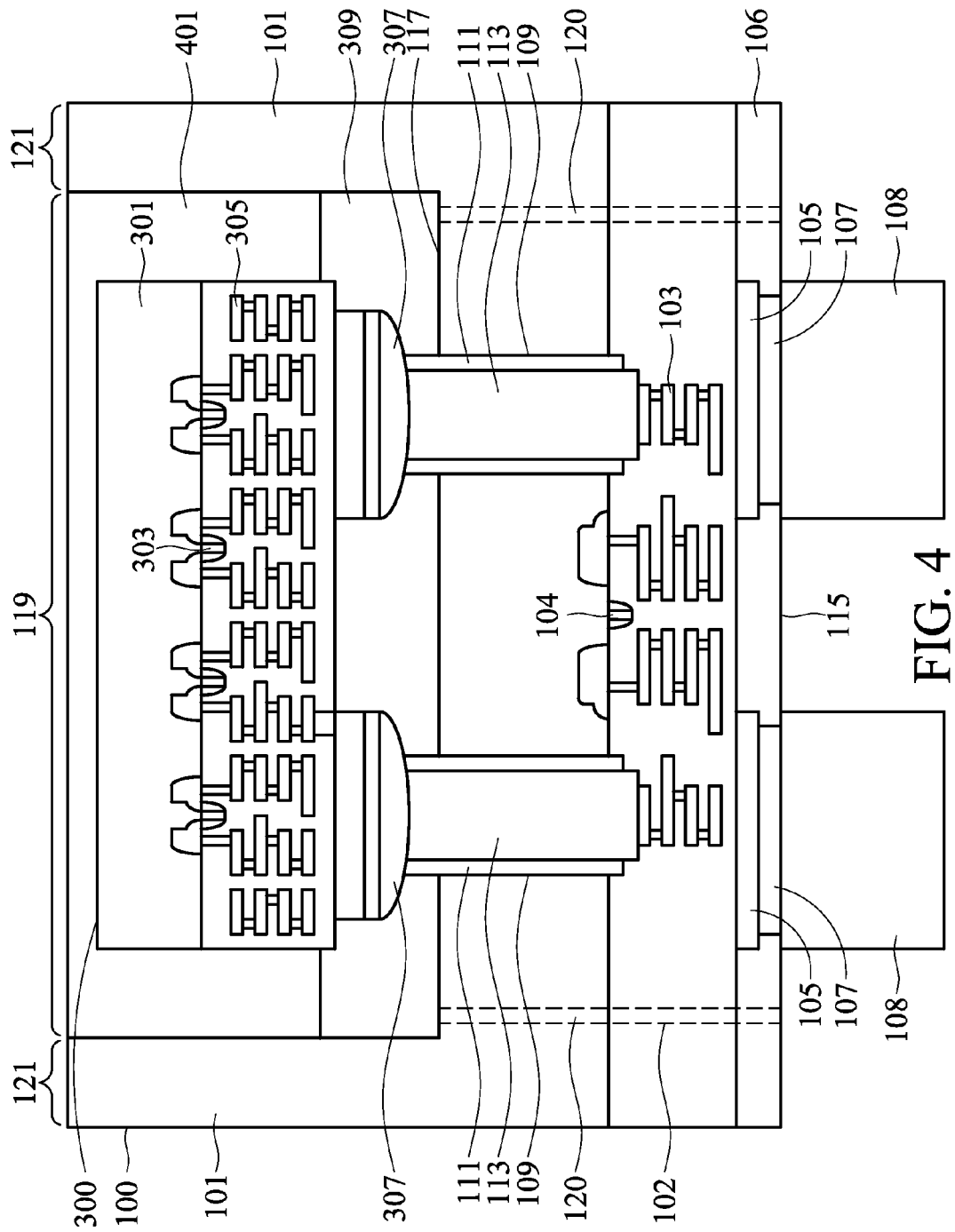
FIG. 4 illustrates the placement of a fill material over the second die in accordance with an embodiment of the present invention.

FIG. 4 illustrates an optional addition of a filler material 401 to further protect the bonded first semiconductor die 102 and second semiconductor die 300. The filler material is preferably placed to fill in the area between the edge 121 and the second semiconductor die 300 and also preferably covers the second semiconductor die 300. The filler material 401 preferably comprises a molding compound, but may alternatively be an epoxy, polyimide, or the like, and is preferably injected or otherwise placed prior to being hardened using a thermal cure process. Any other material and processes, however, that may be used to protect the first semiconductor die 102 and the second semiconductor die 300 may alternatively be used.

Figure 5:
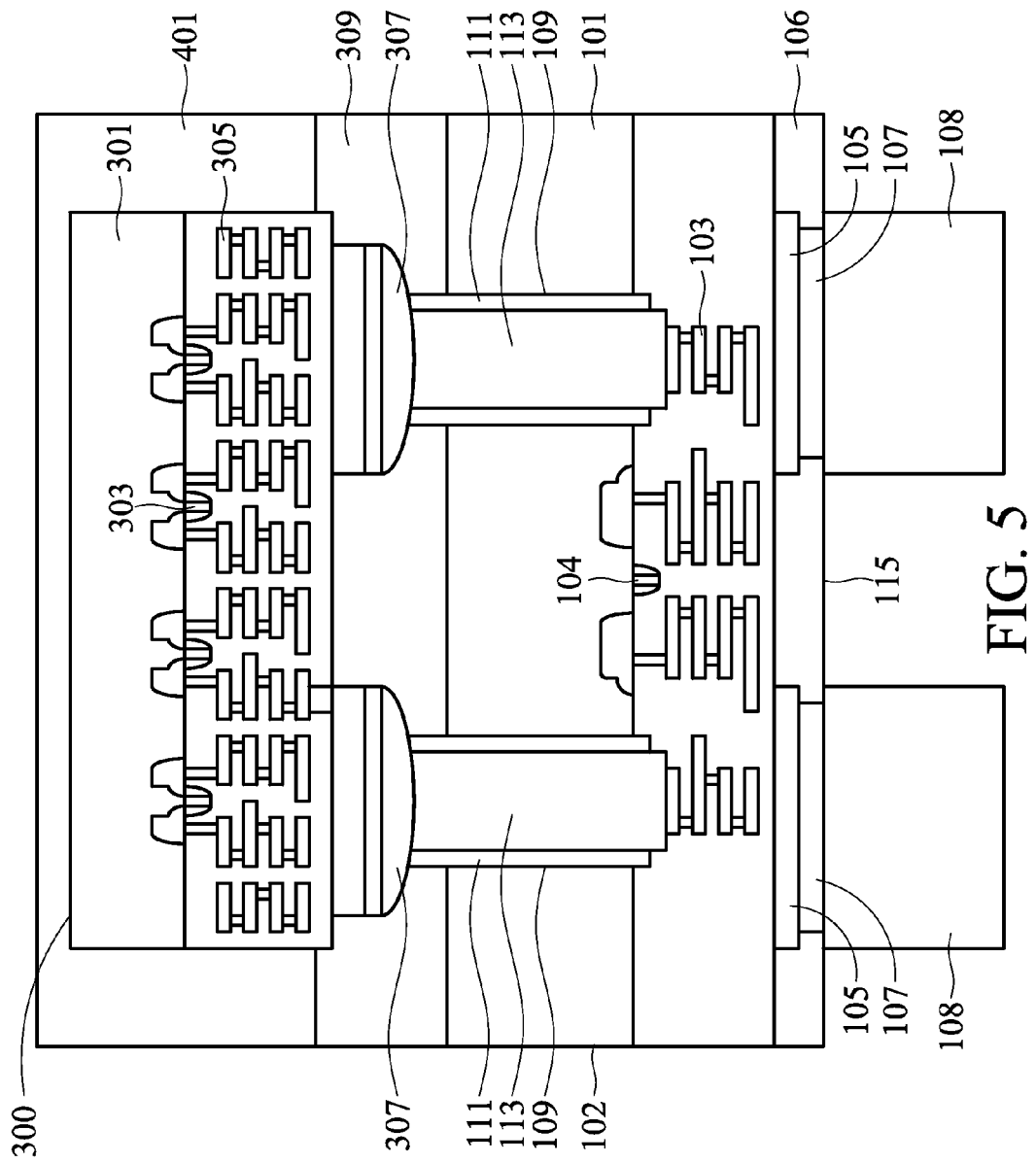
FIG. 5 illustrates the separation of the bonded first die and second die from the edge of the wafer in accordance with an embodiment of the present invention.

FIG. 5 illustrates that, once the second semiconductor dies 300 have been bonded to the first semiconductor dies 102 and the optional filler material 401 has been placed (or not), the individually bonded first semiconductor dies 102 are then preferably singulated from the wafer 100. The singulation is preferably performed by using a saw blade (not shown) to slice the wafer 100 along the areas between the individual first semiconductor dies 102, thereby separating each individual first semiconductor die 102 from the wafer 100. This singulation process additionally separates each of the individual first semiconductor die 102 from the edge 121 of the wafer 100, thereby leaving the singulated first semiconductor dies 102 without the edge 121 of the wafer 100.

By leaving the edge 121 thicker than the remaining portion of the thinned wafer 100, the wafer 100 may better withstand the stresses from further processing, handling, and transport. Further, by extending the edge 121 all the way to the die area 119, more of the wafer 100 remains thicker, thereby improving the ability of the wafer to withstand stress even further. Accordingly, fewer of the first semiconductor dies 102 formed on the wafer 100 will be damaged, leading to an increase in overall yield.

Although the present invention and its advantages have been described in detail, it should be understood that various changes, substitutions and alterations can be made herein without departing from the spirit and scope of the invention as defined by the appended claims. For example, different methods of protecting the edge from being removed are fully intended to be included within the scope of the present invention. As another example, the materials used for the underfill and fill materials may vary greatly while still remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a substrate with a first side and a second side opposite the first side, the first side of the substrate having a first region with a first thickness and a second region with a second thickness, the first thickness being less than the second thickness, the second region being along an outside edge of the substrate;
   a conductive plug extending through the first region of the substrate; and
   a protector over the second region of the substrate and on a sidewall of the substrate.

2. The device of claim 1, further comprising a semiconductor die in electrical contact with the conductive plug.

3. The device of claim 2, further comprising an underfill material between the semiconductor die and the substrate.

4. The device of claim 3, further comprising an encapsulant over the semiconductor die.

5. The device of claim 1, wherein the conductive plug extends above the first side of the substrate.

6. The device of claim 1, wherein the protector comprises a chuck.

7. The device of claim 1, wherein the protector comprises a photoresist.

8. The device of claim 1, wherein the protector comprises an adhesive tape.

9. A device comprising:
   a substrate comprising a first side and a second side, the first side comprising a first region and a second region;
   a cavity in the substrate, the cavity located over the first region of the substrate, wherein the second region of the substrate is located outside of the cavity;
   a conductive plug extending through the first region of the substrate; and
   a protective material over the second region of the substrate and along a sidewall of the substrate, the sidewall extending between the first side and the second side.

10. The device of claim 9, wherein the protective material is a chuck.

11. The device of claim 9, wherein the protective material is a photoresist.

12. The device of claim 9, further comprising a semiconductor die located within the cavity and electrically connected to the conductive plug.

13. The device of claim 12, further comprising an underfill material between the substrate and the semiconductor die.

14. The device of claim 13, further comprising an encapsulant over the semiconductor die and in contact with the underfill material.

15. A semiconductor device comprising:
  a substrate comprising a die region and an edge region, wherein the die region has a thickness less than the edge region;
  a conductive plug extending through the die region of the substrate;
  a protector located over the edge region and extending along a sidewall of the substrate; and
  a semiconductor die located over the die region and being electrically connected to the conductive plug.

16. The semiconductor device of claim 15, further comprising an underfill material between the semiconductor die and the substrate.

17. The semiconductor device of claim 16, further comprising an encapsulant over the semiconductor die.

18. The semiconductor device of claim 15, further comprising a metallization layer electrically connected to the conductive plug, the metallization layer being located on an opposite side of the substrate than the semiconductor die.

19. The semiconductor device of claim 15, wherein the protector is a chuck.

20. The semiconductor device of claim 15, wherein the protector is an adhesive tape.

* * * * *